United States Patent [19]

Araki et al.

[11] Patent Number: 4,756,994
[45] Date of Patent: Jul. 12, 1988

[54] PHOTOCURABLE RESIN COMPOSITION HAVING EXCELLENT ADHESION TO THE SURFACE OF A SUBSTRATE

[75] Inventors: Yasuhiko Araki, Amagasaki; Shigeru Danjo; Hajime Shohi, both of Takatsuki, all of Japan

[73] Assignee: Sekisui Kagaku Kogyo Kabushiki Kaisha, Osaka, Japan

[21] Appl. No.: 871,759

[22] Filed: Jun. 6, 1986

[30] Foreign Application Priority Data

Jun. 7, 1985 [JP] Japan .................................. 60-124960
Jun. 7, 1985 [JP] Japan .................................. 60-124961

[51] Int. Cl.$^4$ .......................... G03C 1/94; G03C 1/68
[52] U.S. Cl. ...................................... 430/281; 430/954; 430/920; 430/922; 430/277; 522/121; 522/102
[58] Field of Search ............... 430/954, 920, 922, 277, 430/281; 522/121, 102

[56] References Cited

U.S. PATENT DOCUMENTS 3,597,343  8/1971  Delzenne et al. ............... 430/920 X
3,622,334  11/1971 Hurley ............................. 430/920 X
3,873,316  3/1975  Velten et al. .................... 430/277 X
4,629,679  12/1986 Uchida et al. ................... 430/954 X Primary Examiner—Roland E. Martin
Assistant Examiner—Cynthia Hamilton
Attorney, Agent, or Firm—Wenderoth, Lind & Ponack

[57] ABSTRACT

A photocurable composition comprising (a) 100 parts by weight of a resin having structural units derived from at least one alpha, beta-unsaturated ethylenically unsaturated monomer, (b) 10 to 300 parts by weight of a photopolymerizable monomer, (c) 0.1 to 20 parts by weight of a photopolymerization initiator, and (d) 0.01 to 1 part by weight of a compound represented by the following general formula (I) or general formula (II)

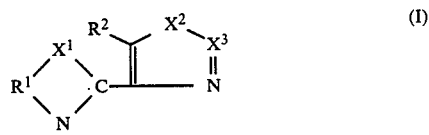

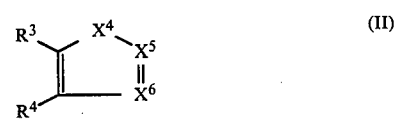

wherein $R^1$ represents a divalent aromatic hydrocarbon group having bonds at the ortho-position to each other; $R^2$ represents hydrogen, an alkyl group having 1 to 4 carbon atoms, a phenyl group or an aryl group having a $C_1$-$C_4$ alkyl; $R^3$ and $R^4$ each represent an alkyl group having 1 to 10 carbon atoms, an aryl group or an aralkyl group; $X^1$ represents oxygen, sulfur or N—$R^5$; $X^2$ represents oxygen, sulfur or NH; $X^3$ represents nitrogen or $CR^6$; $X^4$ represents oxygen, sulfur or $NR^6$; $X^5$ represents nitrogen or $CR^7$; $X^6$ represents nitrogen or CH; $R^5$ represents hydrogen, a hydroxyl group, halogen or an alkyl group having 1 to 4 carbon atoms; $R^6$ represents hydrogen or an alkyl group having 1 to 4 carbon atoms; and $R^7$ represents hydrogen, $NH_2$, halogen or an alkyl group having 1 to 4 carbon atoms.

10 Claims, No Drawings

PHOTOCURABLE RESIN COMPOSITION HAVING EXCELLENT ADHESION TO THE SURFACE OF A SUBSTRATE

This invention relates to a photocurable resin composition, and more specifically, to a photocurable resin composition having excellent adhesion to the surface of a substrate and good etching resistance and being capable of forming an image of high resolution.

Heretofore, imaging by utilizing a photocurable or photopolymerizable composition has been applied, for example, to the production of printed circuit boards by the photoresist method or to the production of relief plates. The desired image may be formed by forming a film of the photocurable or photopolymerizable composition on a transparent support film or the like by coating it on the support film, bringing the film into contact with the surface of a substrate on which to form the image and causing it to adhere firmly to the surface by heat fusion, thereafter exposing the film surface to actinic light through an original image while the transparent support film is left on the uppermost layer or the support film is removed, and developing the exposed film surface by the solution method of dissolving the unexposed portion with a solvent or the peel method of removing the unexposed portion by adhering it to the support film to form an image corresponding to the original image.

One important problem in the use of the photocurable composition in the above applications is that the adhesion strength between the photocurable composition and the surface of a substrate on which to form an image is not sufficient, and therefore, a satisfactory high resolution cannot be obtained. It is particularly so when it is used as a material for resists in the production of printed circuit boards. When IC chips are to be mounted on the printed circuit boards, a resolution of not more than 50 microns is sometimes required, but it is difficult to meet such a requirement.

If the adhesion force between the resist and the copper substrate is not sufficiently large, an etching solution or a plating solution will permeate between the resist and the copper substrate, and the resist will rise above the copper substrate. Consequently, the edge of the resist will be broken by etching, or the plating solution will permeate even to a part below the resist (the phenomenon called "plating migration"). Thus, the linearity of a section of the image may become obscure, and a copper substrate having a good image formed thereon cannot be obtained.

Various methods have been attempted in order to remove such defects. For example, it has been proposed to increase the adhesion strength between the photocurable composition and the substrate by providing an adhesive layer between them, or to add such a compound as sulfonyl chloride or a phosphate salt in the case of the peel method. The former method requires steps of uniformly coating the adhesive layer and drying it in the preparation of an image-forming material, and undesirably becomes complex. The latter has the disadvantage that the photocurable composition has poor storage stability as a result of bleed-out of the additives, and the resolution obtained with the composition is not fully satisfactory.

Japanese Laid-Open Patent Publication No. 13475/1972 proposes the addition of a benzotriazole-type additive. The adhesion strength between the resist and the copper substrate is insufficient, and when the exposed composition is left to stand for several days until development, the resulting image tends to have a much reduced resolution. Japanese Laid-Open Patent Publication No. 702/1978 proposes the addition of a 2-mercaptobenzimidazole derivative. This appears to be directed to an increase in adhesion strength by the reaction of the composition with the mercapto group of the derivative. Howver, a tiny amount of the resist remains adhering to the surface of the copper substrate even after the resist has been removed. The remaining resist cannot be removed by an after-treatment such as soft etching, and becomes a cause of trouble.

It is a principal object of this invention to provide a photocurable resin composition having excellent adhesion to the surface of a substrate on which to form an image, good etching resistance and being capable of easily forming an image having a high resolution.

Other objects of this invention along with its advantages will become apparent from the following description.

According to this invention, there is provided a photocurable composition comprising (a) 100 parts by weight of a resin having structural units derived from at least one alpha, beta-unsaturated ethylenically unsaturated monomer, (b) 10 to 300 parts by weight of a photopolymerizable monomer, (c) 0.1 to 20 parts by weight of a photopolymerization initiator, and (d) 0.01 to 1 part by weight of a compound represented by the following general formula (I) or general formula (II)

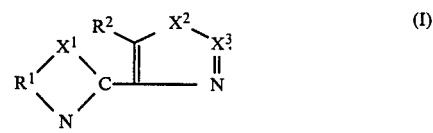

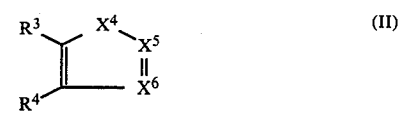

wherein $R^1$ represents a divalent aromatic hydrocarbon group having bonds at the ortho-position to each other; $R^2$ represents hydrogen, an alkyl group having 1 to 4 carbon atoms, a phenyl group or an aryl group having a $C_1$-$C_4$ alkyl; $R^3$ and $R^4$ each represent an alkyl group having 1 to 10 carbon atoms, an aryl group or an aralkyl group; $X^1$ represents oxygen, sulfur or N-$R^5$; $X^2$ represents oxygen, sulfur or NH; $X^3$ represents nitrogen or $CR^6$; $X^4$ represents oxygen, sulfur or $NR^6$; $X^5$ represents nitrogen or $CR^7$; $X^6$ represents nitrogen or CH; $R^5$ represents hydrogen, a hydroxyl group, halogen or an alkyl group having 1 to 4 carbon atoms; $R^6$ represents hydrogen or an alkyl group having 1 to 4 carbon atoms; and $R^7$ represents hydrogen, $NH_2$, halogen or an alkyl group having 1 to 4 carbon atoms.

The composition of this invention will be described below in detail.

(a) Binder resin

In the composition of this invention, a resin having structural units derived from at least one alpha,beta-ethylenically unsaturated monomer is used as a binder resin component. The alpha,beta-unsaturated ethylenically unsaturated monomer used in the preparation of this resin may be the same as any of those which have been used in the production of binder resins in photocurable resin compositions of this type. Specific examples include styrenes such as styrene, o-methylstyrene, m-methylstyrene, p-methylstyrene, alpha-methylstyrene, p-ethylstyrene, 2,4-dimethylstyrene, p-n-hexylstyrene, p-n-octylstyrene, p-methoxystyrene, p-phenylstyrene and 3,4-dimethylchlorostyrene; vinylnaphthalenes such as alpha-vinylnaphthalene; alpha-olefins such as ethylene, propylene, butylene or those having 5 to 30 or more carbon atoms; vinyl halides such as vinyl chloride, vinyl bromide and vinyl fluoride; vinyl esters such as vinyl acetate, vinyl propionate and vinyl butyrate; (meth)acacetate, rylic esters such as methyl acrylate, ethyl acrylate, propyl acrylate, n-butyl acrylate, isobutyl acrylate, n-octyl acrylate, lauryl acrylate, 2-ethylhexyl acrylate, methyl methacrylate, ethyl methacrylate, butyl methacrylate, 2-ethylhexyl methacrylate, phenyl methacrylate and dimethylaminoethyl methacrylate; vinyl ethers such as vinyl methyl ether, vinyl ethyl ether; vinyl ketones such as vinyl methyl ketone and viny ethyl ketone; N-vinyl compounds such as N-vinylpyrrole, N-vinylcarbazole and N-vinylindole; unsaturated carboxylic acids such as acrylic acid, methacrylic acid, crotonic acid, maleic acid (and its anhydride), fumaric acid and itaconic acid; unsaturated nitriles such as acrylonitrile and methacrylonitrile; unsaturated acid amides such as acrylamide and methacrylamide; and amine imides such as 1,2-dimethyl-1-(2-hydroxy-3-butoxypropyl)amine-methacrylimide and 1,2-dimethyl-1-(2-hydroxy-3-methacryloyloxypropyl)aminemethacrylimide.

It is generally desired that polymers or copolymers produced from at least one of these monomers have a molecular weight of several thousand to several millions, preferably several tens of thousand to several hundreds of thousand, and are soluble in solvents which are used to dissolve the photopolymerizable monomer (b), the photopolymerizable initiator (c) and the compound (d) of formula (I) or (II), and also in solvents (including water) used for development.

Examples of the resin used in this invention include polymethacrylic esters, carboxyl-containing copolymers of (meth)acrylic esters and unsaturated carboxylic acids, carboxyl-containing copolymers of styrenes and unsaturated carboxylic acids, and carboxyl-containing copolymers in the form of esters with lower alkanols such as methanol, ethanol, butanol, or propanol.

(b) Photopolymerizable monomer

The photopolymerizable monomer used in the composition of this invention is a monomer which is usually liquid at ordinary temperature and begins to polymerize, and cures, by irradiation of actinic light in the presence of a photopolymerization initiator. The monomer may be a known compound which generally has at least one ethylenic unsaturation and forms a high-molecular polymer by addition reaction initiated by free radical photoreaction. Specific non-limitative examples include diethylene glycol phthalate (meth)acrylate; polyethylene glycol di(meth)acrylates such as triethylene glycol di(meth)acrylate, tetraethylene glycol di(meth)acrylate and nonaethylene glycol di(meth)acrylate; and poly(meth)acrylate monomers such as tripropylene glycol di(meth)acrylate, pentaerythritol tri(meth)acrylate, dipentaerythritol penta(meth)acrylate, dipentaerythritol hexa(meth)acrylate and trimethylolpropane tri(meth)acrylate.

In the present invention, one or mroe of these monomers are used, and the polyacrylate-type monomers are especially preferred.

The photopolymerizable monmer is used in a proportion of 10 to 300 parts by weight, preferably 20 to 100 parts by weight, and more preferably 30 to 70 parts by weight, per 100 parts by weight of the binder resin.

(c) Photopolymerization initiator

The photopolymerization initiator includes compounds having the property of generating free radicals upon irradiation of actinic light such as ultraviolet light, visible light and infrared light to activate and polymerize the photopolymerizable monomer mentioned in (b) above, and photopolymerization initiators known per se in the field of photopolymerizable resins may equally be used in this invention. Specific examples include sulfides such as sodium methyl dithiocarbamate sulfide, tetramethylthiuram monosulfide, diphenyl monosulfide and dibenzothiazoyl mono(di)sulfide; thioxanthone derivatives such as 2-chlorothioxanthone and 2,4-diethylthioxanthone; (di)azo compounds such as hydrazone, azoisobutyronitrile and benzene diazonium chloride; aromatic carbonyl compounds such as benzoin methyl ether, benzoin ethyl ether, benzophenone, dimethylaminobenzophenone, benzoin, benzyl anthraquinone, t-butylanthraquinone, 2-methylanthraquinone, 2-aminoanthraquinone and 2-chloroanthraquinone; dialkylaminobenzoic esters such as butyl p-dimethylaminobenzoate and isopropyl p-diethylaminobenzoate; peroxides such as benzoyl peroxide, di-t-butyl peroxide, dicumyl peroxide and cumene hydroperoxide; and 2,4,5-triphenylimidazolyl dimer. Of these, the thioxanthone derivatives, aromatic carbonyl compounds and dialkylaminobenzoates are preferably used.

The photopolymerization initiator may be selected according to the kind of the photopolymerizable monomer, and its amount is generally 0.1 to 20 parts by weight, preferably 1 to 18 parts by weight, more preferably 2 to 10 parts by weight, per 100 parts by weight of the binder resin.

(d) Adhesion improver

The present invention is characterized in that the compound of general formula (I) or (II) is included into the composition as an additive for improving the adhesion of the photocurable composition to the surface of a substrate.

In general formula (I) or (II), the "divalent aromatic hydrocarbon group having bonds at the ortho-position to each other" is a group represented by the formula

wherein A represents an aromatic ring. Examples of the divalent aromatic ring, such as orthophenylene, lower alkyl-substituted ortho-phenylene,

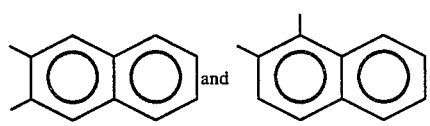

The "alkyl group" may be linear or branched, and includes; for example, methyl, ethyl, n-propyl, isopropyl, n-butyl, sec-butyl and tert-butyl. The "aryl group" includes, for example, phenyl, naphthyl and tolyl. The "aralkyl group" includes, for example, benzyl and phenethyl. The "halogen" includes fluorine, chlorine, bromine and iodine, and chlorine is preferred.

The term "lower" used in the present specification and the appended claims means that an atomic grouping or a compound qualified by this term has not more than 6, preferably not more than 4, carbon atoms Specific examples of the compound of general formula (I) include
2-(4-thiazolyl)benzoxazole,
2-(4-thiazolyl)benzothiazole,
2-(4-thiazolyl)benzimidazole,
2-(4-oxazolyl)benzimidazole,
2-(4-imidazolyl)benzimidazole,
2-[4-(1,2,3-triazolyl]benzimidazole,
1-hydroxy-2-(4-thiazolyl)benzimidazole,
1-chloro-2-(4-thiazolyl)benzimidazole,
1-methyl-2-(4-thiazolyl)benzimidazole,
1-ethyl-2-(4-thiazolyl)benzimidazole,
1-propyl-2-(4-thiazolyl)benzimidazole,
1-butyl-2-(4-thiazolyl)benzimidazole,
2-(4-thiazolyl)-5-ethylbenzimidazole,
2-(4-thiazolyl)-5-propylbenzimidazole,
2-(4-thiazolyl)-5-butylbenzimidazole,
2-(4-thiazolyl)naphthoxazole,
2-(4-thiazolyl)naphthathiazole, and
2-(4-thiazolyl)naphthimidazole.

Of these compounds of general formula (I), those represented by the following formula

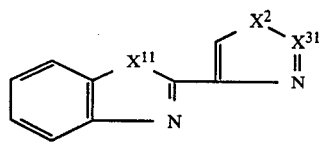

(Ia)

wherein $X^{11}$ represents oxygen, sulfur or NH, $X^{31}$ represents nitrogen or CH, and $X^2$ is as defined hereinabove, are preferred.

Specific examples of the compound of general formula (II) include
4,5-diphenylimidazole,
1-methyl-4,5-diphenylimidazole,
1-ethyl-4,5-diphenylimidazole,
1-propyl-4,5-diphenylimidazole,
1-butyl-4,5-diphenylimidazole,
2-methyl-4,5-diphenylimidazole,
2-ethyl-4,5-diphenylimidazole,
2-chloro-4,5-diphenylimidazole,
4,5-diethylimidazole,
4,5-diphenyloxazole,
2-methyl-4,5-diphenyloxazole,
4,5-diphenylthiazole, and
4,5-diphenyltriazole.

Of these compounds of general formula (II), those represented by the following formula

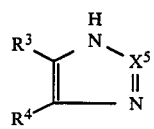

(IIa)

wherein $R^3$, $R^4$ and $X^5$ are as defined hereinabove, are preferred.

Especially preferred among the compounds of general formulae (I) and (II) are 2-(4-thiazolyl)benzimidazole, 2-(4-thiazolyl)benzoxazole, 2-(4-thiazolyl)benzothiazole, 4,5-diphenylimidazole, 4,5-diethylimidazole, and 4,5-diphenyltriazole.

The compounds of general formulae (I) and (II) mentioned above may be used singly or in combination. The amount of the compound (d) used is generally 0.01 to 1 part by weight, preferably 0.015 to 0.8 part by weight, more preferably 0.02 to 0.5 part by weight, per 100 parts by weight of the binder resin.

(e) Other additives

The photocurable resin composition of this invention may contain one or more additives to be described below as required, in addition to the above essential components (a) to (d).

(1) Polymerization inhibitor

Illustrative are antioxidants such as hydroquinone, catechol and resorcinol; phenolic antioxidants such as 2,6-di-tert-butyl-4-methylphenol and p-methoxyphenol; and amine-type antioxidants such as N-phenyl-alphanaphthylamine and p,p'-dimethoxydiphenylamine.

The polymerization inhibitor may be used in a proportion of generally 0.01 to 0.5 part by weight, preferably 0.015 to 0.4 part by weight, per 100 parts by weight of the binder resin.

(2) Coloring agent

Dyes or pigments may be used to improve the color hue and contrast of the photocurable composition upon exposure.

Examples include Ethyl Violet (C.I. 42600), Malachite Green (C.I. 42000), Calcocid Green S (C.I. 44090), New Magenta (C.I. 42425), Red Violet 5RS (C.I. 42690), New Methylene Blue GG (C.I. 51195), C.I. Basic Blue 20 (C.I. 42585), Iodine Green (C.I. 42556), C.I. Direct Yellow 9 (C.I. 19540), and C.I. Acid Yellow 29 (C.I. 18900). C.I. here stands for Color Index.

The coloring agent may be used in an amount of generally 0.01 to 0.5 part by weight, preferably 0.02 to 0.4 part by weight, per 100 parts by weight of the binder resin.

(3) Color former

The color former may be added to the composition of this invention to indicate an exposed area of the photocurable composition upon exposure. It is a leuco dye which is normally colorless but forms a color upon exposure (by irradiation of light having a wavelength of 100 to 500 nm). The leuco dye is used in combination with a color-forming aid.

Examples of the leuco dye are Leuco Crystal Violet, Leuco Malachite Green and Leuco Brilliant Green.

The color-forming aid may, for example, be an imidazolyl dimer such as 2-(p-methoxyphenyl)-4,5-diphenylimidazole dimer and 2-(o-chlorophenyl)-4,5-diphenylimidazole dimer.

The color former may be used in a proportion of generally 0.1 to 2 parts by weight, preferably 0.3 to 1.8 parts by weight, per 100 parts by weight of the binder resin. The amount of the color-forming aid is generally 0.5 to 8 parts by weight, preferably 1 to 6 parts by weight, per 100 parts by weight of the binder resin.

(4) Plasticizer

The plasticizer may be added to increase the flexibility of the composition of this invention and improve its adhesion to a substrate when the composition is used, for example, as a dry photoresist. The addition of the plasticizer produces such an effect that the flexibility of the composition is retained until the later stage of polymerization and curing of the composition proceeds smoothly. Examples of the plasticizer include phthalates such as dibutyl phthalate, dioctyl phthalate and dihexyl phthalate; tricresyl phosphate; polyoxyalkylene glycol esters such as triethylene glycol diacetate and diethylene glycol dibenzoate; lower-molecular-weight polyesters; chlorinated paraffins; and p-toluenesulfonamides such as p-toluenesulfonamide and N-ethyl-p-toluenesulfonamide. Of these, the polyoxyalkylene glycol esters and p-toluenesulfonamides are preferred.

The plasticizer may be used in a proportion of 1 to 25 parts by weight, preferably 3 to 20 parts by weight, per 100 parts by weight of the binder resin.

(5) Acidic substance

Since the compounds of general formulae (I) and (II) are basic, the addition of an acidic substance to the composition of this invention results in a reaction between it and the compound of formula (I) or (II) to form a salt which further improves the adhesion of the composition to the surface of a substrate. When the composition contains a leuco dye, a salt is formed between the acidic substance and the dye to increase the color-formability of the dye at the time of exposure. Examples of the acidic substance having such a function include hydrochloric acid, sulfuric acid, p-toluenesulfonic acid and Lewis acids. Of these, p-toluenesulfonic acid is preferred.

The acidic substance may be used in a proportion of usually 0.05 to 0.4 part by weight, preferably 0.1 to 0.35 part by weight, per 100 parts by weight of the binder resin.

Preparation of the photocurable resin composition

The photocurable resin composition of this invention may be prepared by any desired method. Generally, it is conveniently prepared by dissolving the resin (A) in a solvent such as methyl ethyl ketone, acetone, methanol, ethanol, isopropanol, ethyl Cellosolve or methylene chloride to form a solution (A), dissolving the photopolymerizable monomer (b), the photopolymerization initiator (c) and the compound (d) of general formula (I) or (II) and if required, other additives in the same solvent to form a solution (B), and mixing the solutions (a) and (B).

Utility

The photocurable resin composition of this invention may be used, for example, as a plating resist, an etching resist or a solder resist in the formation of a circuit on a copper-clad laminated board and the production of a relief printing plate, or the production of electronic component parts by etching a copper plate or a stainless steel plate.

In such applications, the compositions of this invention is used as a coating composition or a resist ink composition in the form of a solution in a solvent such as methyl ethyl ketone, acetone, methanol, ethanol, isopropanol, ethyl Cellosolve or methylene chloride. Alternatively, the above coating composition may be formed into a dry film resist (DFR) by coating it on a suitable support and then drying it.

DFR may be produced generally by applying the coating composition to a transparent support film such as a film of polyethylene terephthalate, polyvinyl alcohol or polystyrene, and drying it to form a layer of the photocurable composition on the support film. The thickness of the photocurable composition layer may be properly determined depending upon the type of a circuit to be formed, etc., and is generally in the range of 15 to 100 micrometers.

Preferably, a protective film such as a film of polyethylene or polypropylene is laminated to the surface of the composition layer to prevent injury to the composition layer or adhesion of dirt and dust.

Since the composition of this invention after curing has excellent adhesion to the surface of a substrate, a high resolution can be achieved in image formation by peel development or solvent development. When the composition of this invention is used as a material for photoresists, the improved adhesion of the composition leads to the excellent etching resistance of the photocured layer and therefore to a high resolution. Hence, there is little decrease in resolution on standing after exposure. Furthermoe, when it is used as a material for plating resists, there is no plating migration, and the composition of this invention can be effectively used in applications requiring a high level of accuracy as in the production of a printed circuit board.

The following Examples illustrate the present invention more specifically.

EXAMPLE 1

Six photocurable compositions in accordance with this invention as a solution were prepared by adding 0.2 g of each of the following compounds 1 to 6 to 60 g of poly(methyl methacrylate) (molecular weight 100,000), 15 g of pentaerythritol triacrylate, 15 g of tetraethylene glycol diacrylate, 3 g of benzophenone, 0.4 g of dimethylaminobenzophenone, 0.2 g of Ethyl Violet, 0.1 g of p-methoxyphenol and 200 g of methyl ethyl ketone.

Compound 1: 2-(4-thiazolyl)benzimidazole
Compound 2: 2-(4-thiazolyl)benzoxazole
Compound 3: 2-(4-thiazolyl)benzothiazole
Compound 4: 4,5-diphenylimidazole
Compound 5: 4,5-diethylimidazole
Compound 6: 4,5-diphenyltriazole For comparison, a photocurable composition was prepared as above without using any of compounds 1 to 6, and a photocurable composition was also prepared as above except that 0.2 g of benzotriazole was added instead of the above compound.

Each of the solutions was coated on a polyethylene terephthalate film having a thickness of 25 micrometers so that the thickness of the photocurable layer after drying would become 50 micrometers. The coated layer was then dried at 80° C. for 10 minutes to form an image-forming material.

The surface of the image-forming material was laminated under pressure to the cleaned surface of a substrate for printed circuit boards which was clad with copper on both surfaces and had through-holes. A negative copper tive having a resolution test pattern (20–200 microns) was brought into intimate contact with the laminated surface of the substrate, and exposed to light from a 400 W high-pressure mercury lamp placed 1 m apart from the substrate at 300 millijoule/cm$^2$. Then, the polyethylene terephthalate film was peeled, and trichloroethane was sprayed onto the substrate surface to perform development.

When the compounds 1 to 6 were added in accordance with this invention, the test pattern could be reproduced to an extent of fine lines of 40 microns. However, with the comparative composition containing no such compound, the test pattern was reproduced to an extent of fine lines of 50 microns, and with the composition containing benzotrizazole, the image was reproduced to an extent of fine lines of 45 microns.

Separately, these compositions were used as plating resists, and the substances were subjected to plating of copper pyrophosphate and subsequently to solder plating under the following conditions.

| Copper pyrophosphate plating bath | |
| --- | --- |
| Copper pyrophosphate | 90 g/liter |
| Potassium pyrophosphate | 340 g/liter |
| 28% Aqueous ammonia | 3 ml/liter |
| pH 8.8, 50° C., 3 A/dm$^2$, 30 minutes | |
| Solder plating bath | |
| Lead borofluoride | 380 g/liter |
| Tin borofluoride | 30 g/liter |
| Borofluoric acid | 45 g/liter |
| Glue | 0.5 g/liter |
| pH 1.0, 18° C., 2 A/dm$^2$, 10 minutes | |

With the compositions of this invention containing the compounds 1 to 6, hardly any plating migration was observed. However, the comparative composition containing no such compound, the plating solution got under the resist deep from the end surface of the resist. With the composition containing benzotriazole, considerable plating migration was observed.

Hold test

When in the above development stage, the substrates were left to stand for 3 days after laminating the image-forming material and for three days after exposure, the image could be reproduced to an extent of fine lines of 50 microns in the case of the compositions of this invention containing compounds 1 to 6. With the comparative compositions, however, the image was reproduced to an extent of fine lines of 70 microns, and the resolution was low.

The substrate was subjected to plating using the photocurable resin layer left to stand after exposure as stated above as a plating resist. With the compositions of this invention containing compounds 1 to 6, hardly any plating migration was observed. With the comparatve compositions, considerable plating migration was observed.

EXAMPLE 2

Solutions were prepared by adding 5 g of a propyl half-ester of styrene/maleic anhydride copolymer (acid value 180; softening temperature by the ring-and-ball method about 180° C.) to the six photocurable compositions prepared in Example 1, and using these solutions, the same development and plating operations as in Example 1 were carried out.

The images after the development were resolved to an extent of fine lines of 25 microns in all cases. After plating, no plating migration was observed.

When in the development stage, the substrates were left to stand for 3 days after lamination of the image-forming materials under pressure and for 3 days after exposure, the developed images were resolved to an extent of fine lines of 30 microns. After plating, no plating migration was observed.

EXAMPLE 3

Photocurable compositions as a solution were prepared by adding 0.3 g of compound 1 or 4 indicated in Example 1 to 60 g of methyl methacrylate/acrylic acid copolymer (acrylic acid content 2% by weight; molecular weight 100,000), 8 g of triethylene glycol diacetate, 25 g of trimethylolpropane triacrylate, 4 g of tert-butylanthraquinone and 200 g of methyl ethyl ketone. For comparison, a solution was prepared as above without adding compound 1 or 4, and solutions were prepared as above except that 0.1 g of benzotriazole (comparative compound 1) was added instead of the compound 1 or 4, or 0.2 g of 2-mercaptobenzimidazole (comparative compound 2). Using these solutions, the same development as in Example 1 was carried out.

With the photocurable compositions containing compound 1 or 4 in accordance with this invention, the developed images were resolved to an extent of fine lines of 40 microns. In the case of the comparative compositions, the images after development were resolved only to an extent of fine lines of 80 microns (without the addition of the compound 1 or 4), fine lines of 45 microns (containing comparative compound 1), and fine lines of 50 microns (containing comparative compound 2).

When in the development stage, the substrate were left to stand for 3 days after lamination of the image-forming materials and for 3 days after exposure, the developed images were resolved to an extent of fine lines of 60 microns in the case of the compositions of this invention. However, with the comparative composition not containing compound 1 or 4, the image could be resolved only to an extent of fine lines of 120 microns, and with the compositions containing comparative compounds 1 and 2, the images were reproduced to an extent of fine lines of 70 microns, and reddening occurred on the surface of the copper substrate after the development The resulting substrates were then etched with ferric chloride (42° Baume), and the resist was removed by using methylene chloride. Then, the copper circuit was treated for 2 minutes with a 10% aqueous solution of sodium persulfate in order to impart durability to it, and then subjected to nickel plating or gold plating. With the compositions of this invention, plating was carried out sufficiently. In the comparative runs, non-plated parts were observed here and there and the plating was insufficient (when no compound 1 or 4 was added), or the plated layer easily peeled (when comparative compounds 1 and 2 were added).

EXAMPLE 4

In each run, a photocurable composition as a solution was prepared by mixing 60 g of poly(methyl methacrylate) (molecular weight: 100,000), 20 g of tetraethylene glycol diacrylate, 10 g of trimethylolpropane triacrylate, 1 g of 2,4-diethylthioxanthone, 2 g of butyl p-dimethylaminobenzoate, 0.5 g of Leuco Crystal Violet, 2 g of 2-(o-chlorophenyl)-4,5-diphenylimidazole dimer, 0.03 g of Malachite Green, 5 g of p-toluenesulfonamide, 0.01 g of p-methoxyphenol, 0.2 g of p-toluenesulfonic acid, 200 g of methyl ethyl ketone and 2-(4-thiazolyl)-benzimidazole in each of the amounts indicated in the following table.

An image-forming material was prepared by using this solution in the same way as in Example 1, and subjected to a resolution test using a test pattern in the same way as in Example 1. Then, copper pyrophosphate plating and solder plating were carried out under the same conditions as in Example 1, and the state of plating migration was observed. The image-forming material was also subjected to the same hold test as in Example 1. The results are also tabulated below.

| Run No. | 1 | 2 | 3 | 4 | 5 |
|---|---|---|---|---|---|
| Amount (g) of 2-(4-thiazolyl)benzimidazole | 0.005 | 0.05 | 0.18 | 0.42 | 1.0 |
| Resolution (microns) | 80 | 30 | 30 | 60 | >200 |
| Plating migration | great | none | none | none | plating impossible |
| [Hold Tes] Resolution (microns) | 90 | 30 | 30 | 60 | >200 |
| Plating migration | great | none | none | none | plating impossible |

EXAMPLE 5

A photocurable composion as a solution was prepared by mixing 50 g of methyl methacrylate/butyl methacrylate/2-ethylhexyl acrylate/methacrylic acid copolymer (60/10/10/20; molecular weight 100,000), 20 g of tetraethylene glycol diacrylate, 10 g of trimethylolpropane triacrylate, 1.5 g of 2,4-diethylthioxanthone, 3 g of isopropyl p-dimethylaminobenzoate, 0.5 g of Leuco Crystal Violet, 3 g of 2-(o-chlorophenyl)-4,5-diphenylimidazolyl dimer, 0.03 g of Malachite Green, 10 g of p-toluenesulfonamide, 0.02 g of p-methoxyphenol, 0.05 g of 2-(4-thiazolyl)benzimidazole, 0.2 g of p-toluenesulfonic acid, and 200 g of methyl ethyl ketone.

An image-forming material was prepared by using this solution in the same way as in Example 1, and subjected to a resolution test using a test pattern as in Example 1 except that the development was carried out by spraying a 1% aqueous solution of sodium carbonate at 40° C. An image having a resolution of 30 microns was obtained.

The resulting product was used as a plating resist, and the substrate was subjected to copper sulfate plating under the following conditions, and then to solder plating under the same conditions as described in Example 1.

| Copper sulfate plating bath | |
|---|---|
| Copper sulfate | 220 g/liter |
| Sulfuric acid | 50 g/liter |
| Chlorine ion | 50 mg/liter |
| pH not more than 1.0, 25° C., 2 A/dm², 50 minutes | |
| Plating migration was hardly observed. | |

EXAMPLE 6

Example 4 as repeated except that 0.05 part by weight of 2-(4-imidazolyl)benzimidazole was added instead of 2-(4-thiazolyl)benzimidazole. The resolution was 30 microns, and plating migration was not observed.

In the hold test, the resolution was 30 microns, and there was no plating migration.

What is claimed is:

1. A photocurable resin composition comprising
   (a) 100 parts by weight of a resin having structural units derived from at least one alpha, beta-unsaturated ethylenically unsaturated monomer,
   (b) 10 to 300 parts by weight of a photopolymerizable monomer,
   (c) 0.1 to 20 parts by weight of a photopolymerization initiator, and
   (d) 0.01 to 1 part by weight of a compound represented by the following general formula (I).

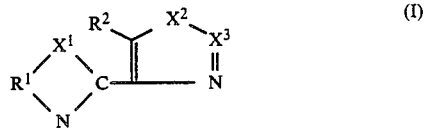

wherein R¹ represents a divalent aromatic hydrocarbon group having bonds at the ortho-position to each other; R² represents hydrogen, an alkyl group having 1 to 4 carbon atoms, a phenyl group or an aryl group having a $C_1$-$C_4$ alkyl; $X^1$ represents oxygen, sulfur or N—$R^5$; $X^2$ represents oxygen, sulfur or NH; $X^3$ represents nitrogen or $CR^6$; $R^5$ represents hydrogen, a hydroxyl group, halogen or an alkyl group having 1 to 4 carbon atoms; and $R^6$ represents hydrogen or an alkyl group having 1 to 4 carbon atoms.

2. The composition of claim 1 wherein the resin (a) is selected from the group consisting of poly(methacrylates), carboxyl-containing copolymers of (meth)acrylic esters and unsaturated carboxylic acids, carboxyl-containing copolymers of styrenes and unsaturated carboxylic acids and lower alkanol esters of said carboxyl-containing copolymers.

3. The composition of claim 1 wherein the photopolymerizable monomer (b) is a poly(meth)acrylate monomer.

4. The composition of claim 1 wherein the amount of the photopolymerizable monomer (b) is 20 to 100 parts by weight.

5. The composition of claim 1 wherein the photopolymerization initiator (c) is selected from the group consisting of thioxanthone derivatives, aromatic carbonyl compounds and dialkylaminobenzoic acid esters.

6. The composition of claim 1 wherein the amount of the photopolymerization initiator (c) is 1 to 18 parts by weight.

7. The composition of claim 1 wherein the compound (d) is selected from the group consisting of compounds of the following formulae (Ia)

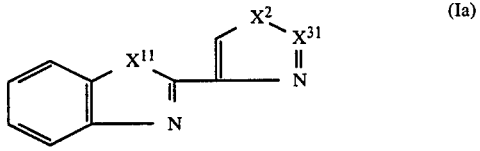

wherein $X^{11}$ represents oxygen, sulfur or NH, $X^{31}$ represents nitrogen or CH, and $X^2$ is as defined in claim 1.

8. The composition of claim 1 wherein the compound (d) is 2-(4-thiazolyl)benzimidazole, 2-(4-thiazolyl)benzoxazole or 2-(4-thiazolyl)benzothiazole.

9. The composition of claim 1 wherein the amount of the compound (d) is 0.015 to 0.8 part by weight.

10. A dry film resist comprising a transparent support film and the photocurable composition of claim 1 applied thereto.

* * * * *